US012532466B2

United States Patent
Chen et al.

(10) Patent No.: US 12,532,466 B2
(45) Date of Patent: Jan. 20, 2026

(54) SEMICONDUCTOR DEVICE HAVING SOURCE LEADING-OUT CONTACTS AND SOURCE LAYER, MEMORY DEVICE, AND MEMORY SYSTEM

(71) Applicant: YANGTZE MEMORY TECHNOLOGIES CO., LTD., Wuhan (CN)

(72) Inventors: He Chen, Wuhan (CN); Lei Huang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 479 days.

(21) Appl. No.: 18/089,434

(22) Filed: Dec. 27, 2022

(65) Prior Publication Data

US 2023/0132948 A1    May 4, 2023

Related U.S. Application Data

(63) Continuation of application No. PCT/CN2022/083196, filed on Mar. 25, 2022.

(30) Foreign Application Priority Data

Mar. 26, 2021    (CN) .......................... 202110323821.9

(51) Int. Cl.
*H10B 43/10*    (2023.01)
*H10B 41/10*    (2023.01)
(Continued)

(52) U.S. Cl.
CPC ............. *H10B 43/10* (2023.02); *H10B 41/10* (2023.02); *H10B 41/27* (2023.02); *H10B 41/35* (2023.02);
(Continued)

(58) Field of Classification Search
CPC ........ H10B 43/10; H10B 41/10; H10B 41/27; H10B 41/35; H10B 41/40; H10B 43/27;
(Continued)

(56) References Cited

U.S. PATENT DOCUMENTS

2019/0019563 A1    1/2019    Lee
2019/0102104 A1    4/2019    Righetti et al.
(Continued)

FOREIGN PATENT DOCUMENTS

CN    111009275 A    4/2020
CN    111566816 A    4/2020
(Continued)

OTHER PUBLICATIONS

International Search Report issued in corresponding International Application No. PCT/CN2022/078785, mailed on Jun. 2, 2022, 5 pages.
(Continued)

*Primary Examiner* — Ratisha Mehta
*Assistant Examiner* — Brad A Knudson
(74) *Attorney, Agent, or Firm* — BAYES PLLC

(57) ABSTRACT

A semiconductor device, a memory device, and a memory system are provided. The semiconductor device includes an array device and source leading-out contacts. The array device includes channel structures and a source layer connected with the channel structures. The source leading-out contacts are connected with the source layer. The source leading-out contacts and the channel structures are located on two sides of the source layer, respectively. Orthographic projections of the source leading-out contacts on the source layer are in evenly spaced distribution.

20 Claims, 10 Drawing Sheets

(51) Int. Cl.
  *H10B 41/27* (2023.01)
  *H10B 41/35* (2023.01)
  *H10B 41/40* (2023.01)
  *H10B 43/27* (2023.01)
  *H10B 43/35* (2023.01)
  *H10B 43/40* (2023.01)
  *H10B 80/00* (2023.01)

(52) U.S. Cl.
  CPC ............ *H10B 41/40* (2023.02); *H10B 43/27* (2023.02); *H10B 43/35* (2023.02); *H10B 43/40* (2023.02); *H10B 80/00* (2023.02)

(58) Field of Classification Search
  CPC ........ H10B 43/35; H10B 43/40; H10B 80/00; H01L 25/065; H01L 25/0652; H01L 25/0655; H01L 25/0657; H01L 25/16; H01L 25/162; H01L 25/165; H01L 25/167; H01L 25/18
  See application file for complete search history.

(56) References Cited

U.S. PATENT DOCUMENTS

| | | | | |
|---|---|---|---|---|
| 2020/0111535 | A1* | 4/2020 | Han | .................. G11C 16/16 |
| 2021/0320094 | A1* | 10/2021 | Zhang | .................. H01L 24/08 |
| 2021/0320118 | A1* | 10/2021 | Zhang | .................. H10B 43/40 |
| 2021/0320122 | A1* | 10/2021 | Zhang | .................. H10B 41/50 |

FOREIGN PATENT DOCUMENTS

| | | |
|---|---|---|
| CN | 111566815 A | 8/2020 |
| CN | 112204742 A | 1/2021 |
| CN | 112352315 A | 2/2021 |
| CN | 112908389 A | 6/2021 |
| CN | 113078164 A | 7/2021 |
| JP | 2017511978 A | 4/2017 |
| KR | 20130007703 A | 1/2013 |

OTHER PUBLICATIONS

Notice of Reasons for Refusal issued in corresponding Japanese Application No. 2023-556974, dated Aug. 27, 2024, 14 pages.

* cited by examiner

SEMICONDUCTOR DEVICE HAVING SOURCE LEADING-OUT CONTACTS AND SOURCE LAYER, MEMORY DEVICE, AND MEMORY SYSTEM

CROSS-REFERENCE TO RELATED APPLICATIONS

This application is a continuation of International Application No. PCT/CN2022/083196, filed on Mar. 25, 2022, which claims the benefit of priority to Chinese Application No. 202110323821.9 filed on Mar. 26, 2021, both of which are incorporated herein by reference in their entireties.

TECHNICAL FIELD

The present disclosure generally relates to electronic devices, and more particularly, to a semiconductor device, a memory device, and a memory system.

BACKGROUND

In a novel 3D NAND structure, a first silicon substrate is formed first. A plurality of array devices are formed on the front surface of the first silicon substrate and include a plurality of NAND strings, and then, an array interconnect layer is formed on the plurality of NAND strings. Meanwhile, a second silicon substrate is formed, a periphery device is formed on the second silicon substrate, and a periphery interconnect layer is formed on the periphery device. Then, the array interconnect layer on the array device is connected with the periphery interconnect layer on the periphery device using a manner, such as bonding, etc. Then, the first silicon substrate is removed, and a source layer is formed on a side, where the first silicon substrate is removed, of the array device; source leading-out contacts, for example, N-well pick-up layers (NPUs), are formed on the source layer; source ends are connected to the outside, and then, the NPUs are joined with an AL metal layer (connected to the periphery device), thereby enabling the array device to be electrically connected with the periphery device to implement signal transmission.

However, in the prior art, voltage drops between the NAND strings and the source leading-out contacts fluctuate too much, thus affecting the device's performance.

SUMMARY

The present disclosure provides a semiconductor device, comprising: an array device comprising a plurality of channel structures, and a source layer connected with the plurality of channel structures; and a plurality of source leading-out contacts connected with the source layer, and the plurality of source leading-out contacts and the plurality of channel structures being located on two sides of the source layer respectively; orthographic projections of the plurality of source leading-out contacts on the source layer being in evenly spaced distribution.

In some implementations, the semiconductor device further comprises a plurality of rows of gate line slit structures extending along a first direction parallel to the source layer, and two adjacent rows of the gate line slit structures have a first pitch therebetween.

In some implementations, the plurality of source leading-out contacts are arranged into multiple rows along the first direction, and the source leading-out contacts of the same row are distributed at equal intervals along the first direction.

In some implementations, the plurality of source leading-out contacts are arranged into multiple rows along the first direction, and two adjacent rows of the source leading-out contacts have a second pitch therebetween, and the second pitches between any two adjacent rows of the source leading-out contacts are the same.

In some implementations, the first pitch is equal to the second pitch.

In some implementations, an orthographic projection of each of the source leading-out contacts on the source layer is located between orthographic projections of two adjacent rows of the gate line slit structures on the source layer.

In some implementations, the orthographic projection of each of the source leading-out contacts on the source layer is located in a center between orthographic projections of two adjacent rows of the gate line slit structures on the source layer.

In some implementations, the orthographic projections of two adjacent rows of the gate line slit structures on the source layer have therebetween the orthographic projections of the plurality of rows of the source leading-out contacts on the source layer.

In some implementations, the orthographic projection of each of the source leading-out contacts on the source layer has an overlapping portion with the orthographic projection of one of the gate line slit structures on the source layer.

In some implementations, the source leading-out contacts comprise first source leading-out contacts and second source leading-out contacts, orthographic projections of the first source leading-out contacts on the source layer are located between the orthographic projections of two adjacent rows of the gate line slit structures on the source layer, and orthographic projections of the second source leading-out contacts have overlapping portions with orthographic projections of the gate line slit structures on the source layer.

In some implementations, the plurality of source leading-out contacts are disposed in one-to-one correspondence with the plurality of channel structures.

In some implementations, the orthographic projections of the source leading-out contacts on the source layer are strip-shaped, and a length direction thereof is disposed along the first direction parallel to the source layer.

In some implementations, the orthographic projections of the source leading-out contacts on the source layer are strip-shaped, and a width direction thereof is disposed along the first direction parallel to the source layer.

In some implementations, the orthographic projections of the source leading-out contacts on the source layer are strip-shaped, and the length direction thereof has an included angle with the first direction parallel to the source layer.

In some implementations, the plurality of source leading-out contacts are arranged into multiple rows along the first direction parallel to the source layer, and the plurality rows of the source leading-out contacts are aligned in a second direction that is perpendicular to the first direction and parallel to the source layer.

In some implementations, the plurality of source leading-out contacts are arranged into multiple rows along the first direction parallel to the source layer, and two adjacent rows of the source leading-out contacts are in misaligned distribution in the first direction.

In some implementations, the semiconductor device further comprises a metal interconnect layer covering the plurality of source leading-out contacts.

In some implementations, the metal interconnect layer comprises a plurality of first routes that extend continuously and are parallel, and second routes for connecting two adjacent ones of the first routes.

In some implementations, the orthographic projections of the source leading-out contacts on the source layer are strip-shaped, and the plurality of first routes cover the plurality of source leading-out contacts, and continuously extend along the length direction of the source leading-out contacts.

In some implementations, the plurality of second routes cover the plurality of source leading-out contacts, and the plurality of first routes cover the plurality rows of the gate line slit structures.

In some implementations, regions between two adjacent ones of the first routes are second route regions, and the second routes in two adjacent ones of the second route regions are in interleaved distribution.

In some implementations, the orthographic projections of the source leading-out contacts on the source layer are round or square.

The present disclosure further provides a memory device, comprising: the semiconductor device provided by any of the above implementations; and a periphery circuit electrically connected with the semiconductor device.

The present disclosure further provides a memory system, comprising: the memory device provided by any of the foregoing implementations; and a controller electrically connected with the memory device and used for controlling the memory device to store data.

BRIEF DESCRIPTION OF THE DRAWINGS

Particular implementations of the present disclosure are described in detail below in conjunction with the figures, which will make the technical solution and other beneficial effects of the present disclosure apparent.

DETAILED DESCRIPTION

Figure 1:
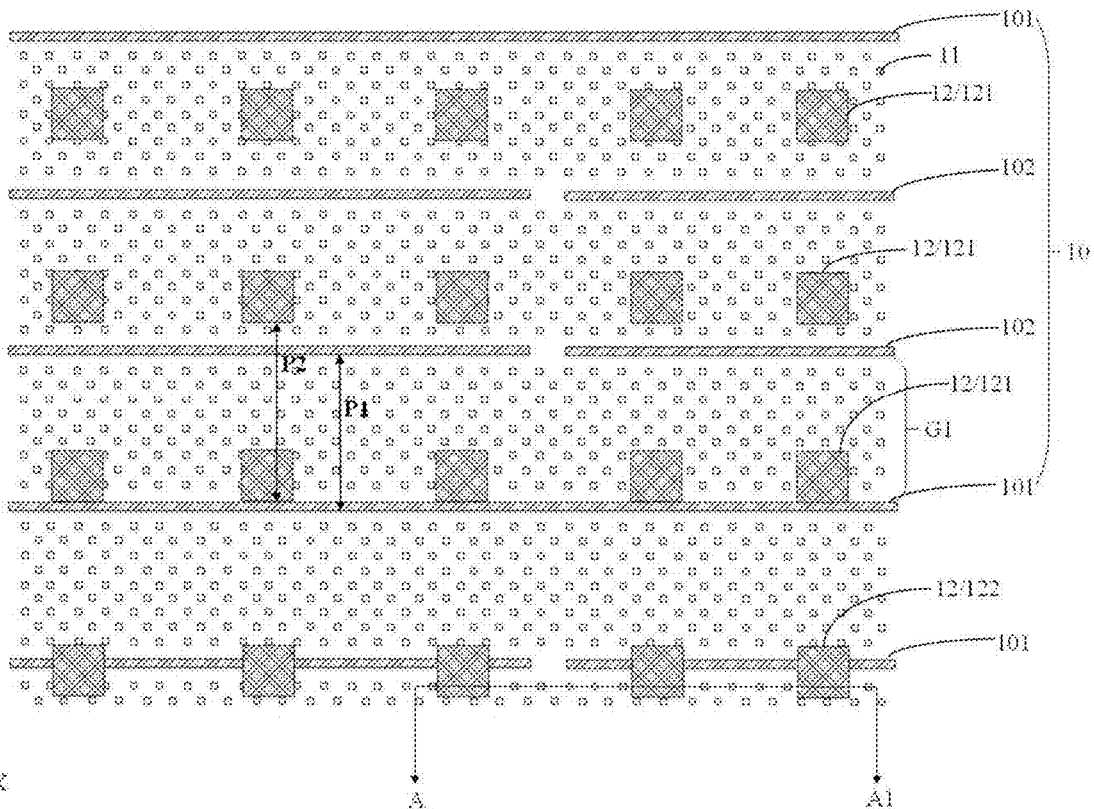
FIG. 1 is a top-down structural diagram I of a semiconductor device provided by a first implementation of the present disclosure.

The technical solutions in implementations of the present disclosure will be described below clearly and completely in conjunction with the figures in the implementations of the present disclosure. Apparently, the described implementations are merely part of the implementations of the present disclosure, rather than all of the implementations. Based on the implementations in the present disclosure, all other implementations obtained by those skilled in the art without creative work shall fall in the scope of the present disclosure.

It should be understood that although the terms, such as first, second, and the like, may be used herein to describe various components, these components should not be limited to such terms. Such terms are used to distinguish one component from another component. For example, a first component may be called a second component, and similarly, a second component may be called a first component, without departing from the scope of the present disclosure.

It should be understood that when one component is "on" and "connected with" another component, it may be directly on or connected with another component, or interposed components may also be present. Other words for describing a relationship between the components should be interpreted similarly.

As used herein, the term "layer" refers to a material portion including a region with a thickness. A layer can extend over the entirety of an underlying or overlying structure or may have an extent less than the extent of an underlying or overlying structure. Furthermore, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductive layers and contact layers (in which contacts, interconnect lines and/or vertical interconnect accesses (VIAs) are formed) and one or more dielectric layers.

As used herein, the term "semiconductor device" refers to a semiconductor device with a vertically oriented array structure on a laterally-oriented substrate so that the array structure extends in a vertical direction with respect to the substrate. By using Cartesian coordinates to represent directions and taking a substrate or a source layer as a reference herein, the term "first direction" refers to a direction parallel to the substrate (or the source layer), denoted by "X"; the term "longitudinal" refers to a direction perpendicular to the substrate (or the source layer) and also perpendicular to the X direction, denoted by "Z"; and the term "second direction" refers to a direction perpendicular to X and Z, i.e., a direction parallel to the substrate (or the source layer) and perpendicular to X, denoted by "Y."

It should be noted that graphical representations as provided in the implementations of the present disclosure merely state a basic conception of the present disclosure illustratively. Although the graphical representations only show the related components in the present disclosure, which are not drawn according to a number of and shapes of the components or to a scale during practical implementation, the morphologies, number, and scale of the various components may be changed at will during their practical implementation, and the layout morphologies of the components may be more complex.

Implementations of the present disclosure provide a semiconductor device. For example, referring to FIGS. 1-4, the semiconductor device 100 may comprise an array device that comprises a plurality of rows of gate line slit structures 10 extending in a first direction (X), channel structures 11 located between the respective rows of the gate line slit structures 10, and a source layer 1042 electrically connected with the plurality of channel structures 11. The semiconductor device 100 further comprises a plurality of source leading-out contacts 12 that are electrically connected with the source layer 1042 and distributed on a surface of the source layer 1042 in an evenly spaced manner, that is, orthographic projections of the plurality of source leading-out contacts 12 on the source layer 1042 are in evenly spaced distribution. The source layer is located between the channel structures 11 and the source leading-out contacts 12. That is, the channel structures 11 and the plurality of source leading-out contacts 12 are located on two sides of the source layer in a longitudinal direction (for example, a Z direction in FIG. 1) respectively. The semiconductor device 100 further comprises a metal interconnect layer 105 covering the source leading-out contacts 12 to electrically connect the source leading-out contacts 12 with the metal interconnect layer 105, implementing electrical connection of the channel structures with an external circuit by the metal interconnect layer 105.

In some implementations, the gate line slit structures 10 comprise at least two rows of first gate line slit structures 101, and at least one row of second gate line slit structures 102 between two adjacent rows of the first gate line slit structures 101, the first gate line slit structures 101 divide the array device into a plurality of memory blocks, and the second gate line slit structures 102 divide the memory blocks into a plurality of finger memory blocks G1, in which the first gate line slit structures 101 extend continuously in the first direction (X), the second gate line slit structures 102 are disconnected along a second direction (Y), that is, having a plurality of spaced segments of sub second gate line slit structures.

In some implementations, distances between two adjacent rows of the first gate line slit structures 101 may be equal. In some implementations, distances between two adjacent rows of the second gate line slit structures 102 may be equal. In some implementations, distances between any two adjacent rows of the gate line slit structures 10 may be equal; for example, two adjacent rows of the gate line slit structures 10 have a first pitch P1 in the second direction (Y), and the first pitch P1 may refer to, in two adjacent rows of the gate line slit structures 10 in FIG. 1, a distance from the top of one row of the gate line slit structures 10 to the top of the other row of the gate line slit structures 10, or a distance from the bottom of one row of the gate line slit structures 10 to the bottom of the other row of the gate line slit structures 10.

Figure 4:
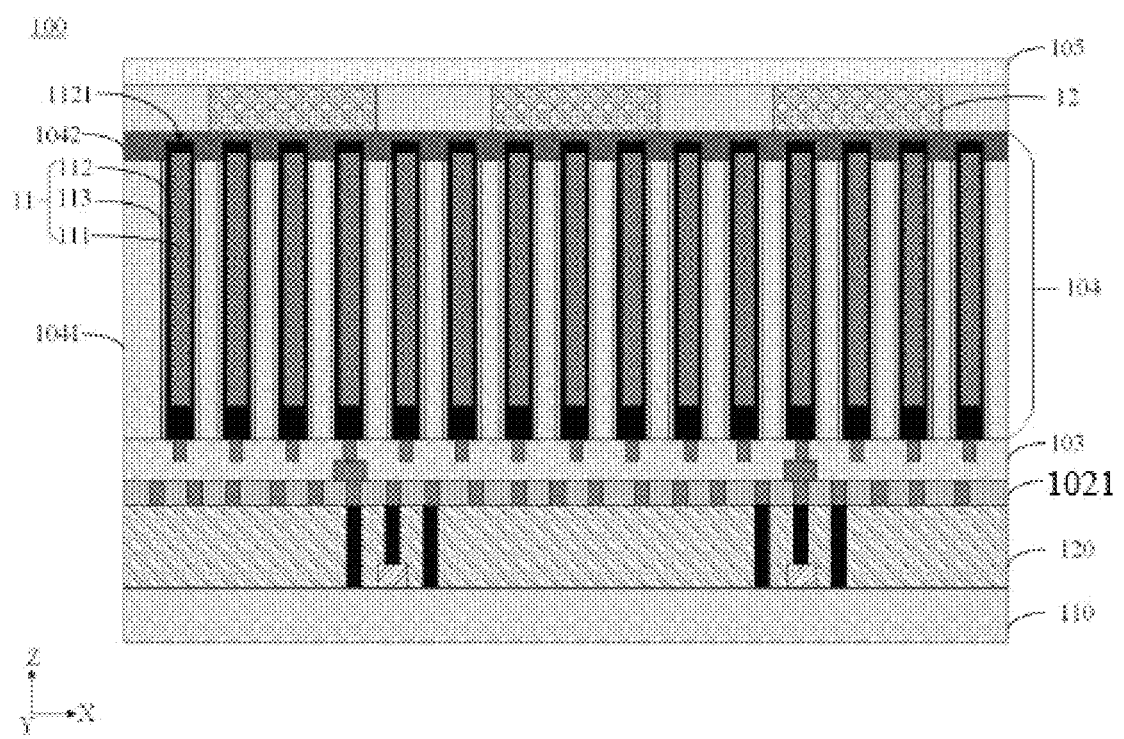
FIG. 4 is a sectional structural diagram along A-A1 in FIG. 1 of the present disclosure.

Meanwhile, referring to FIG. 4, FIG. 4 is a sectional structural diagram along A-A1 in FIG. 1 of the present disclosure. The semiconductor device 100 comprises a substrate 110 in a longitudinal direction (Z), a periphery device layer 120 on the substrate 110, a periphery interconnect layer 1021 on the periphery device layer 120, an array interconnect layer 103 on the periphery interconnect layer 1021, an array device 104 on the array interconnect layer 103, source leading-out contacts 12 on the array device 104, and a metal interconnect layer 105 on the source leading-out contacts 12.

In some implementations, the array device 104 comprises a deck 1041, channel structures 11 through the deck 1041 in the longitudinal direction (Z), gate line slit structures (not shown in the figure) through the deck 1041 in the longitudinal direction (Z), and a source layer 1042 located on the deck 1041 and electrically connected with the channel structures 11. The channel structures 11 comprise insulating layers 111 extending along the longitudinal direction (Z), channel layers 112 surrounding the insulating layers 111, and memory layers 113 surrounding around the channel layers 112, and the channel layers 112 have end portions 1121 not covered by the memory layers 113. Particularly, the source layer 1042 covers the end portions 1121 of the channel layers 112, and is connected with the channel layers 112 of the channel structures 11.

In some implementations, the metal interconnect layer 105 may comprise AL routes, the source layer 1042 may be N-type doped polysilicon, and the deck 1041 is formed by alternate stacking of interlayer insulating layers and gate layers. Top-down graphics (taking FIG. 4 as a reference) of the source leading-out contacts 12, or orthographic projections of the source leading-out contacts 12 on the source layer 1042 are round or square; alternatively, in some other implementations, the top-down graphics (taking FIG. 4 as a reference) of the source leading-out contacts 12 or the orthographic projections of the source leading-out contacts 12 on the source layer 1042 may be in other shapes, for example, strip-shaped, petal-shaped, fusiform, dumbbell-shaped, etc.

It may be understood that when the channel layers 112 of the channel structures 11 form an electrical connection with the source leading-out contacts 12 via the source layer 1042, since the lengths of the channel structures 11 and a thickness of the source layer 1042 are given, distances from the different channel structures 11 to the source leading-out contacts 12 depend on distances between the channel structures 11 and the source leading-out contacts 12 in an XY plane, and distribution of the channel structures 11 around the source leading-out contacts 12 and the distances from the channel structures 11 to the source leading-out contacts 12 will affect voltage drops, so that a distribution condition of the source leading-out contacts 12 is particularly important.

In some implementations of the present disclosure, the orthographic projections of the plurality of source leading-out contacts 12 on the source layer 1042 are arranged in an evenly spaced distribution manner, wherein the evenly spaced distribution may be embodied using multiple forms, for example, may be embodied by evenly spaced distribution in the first direction (X) or/and the second direction (Y) or/and other directions; for example, in some implementations, the plurality of source leading-out contacts 12 are arranged into multiple rows along the first direction (X), and the source leading-out contacts 12 of the same row are distributed at equal intervals along the first direction (X). Alternatively, in some implementations, the plurality of source leading-out contacts 12 are arranged into multiple rows along the first direction (X), and distances between any two adjacent rows of the source leading-out contacts 12 are equal. Alternatively, in some implementations, the plurality of source leading-out contacts 12 are arranged into multiple rows along the first direction (X), the source leading-out contacts 12 of the same row are distributed at equal intervals along the first direction (X), and the source leading-out contacts 12 of different rows are aligned in the second direction (Y). Alternatively, in some implementations, the plurality of source leading-out contacts 12 are arranged into multiple rows along the first direction (X), the source leading-out contacts 12 of the same row are distributed at equal intervals along the first direction (X), and the source leading-out contacts 12 of two adjacent rows are in misaligned distribution in the first direction (X). It may be understood that the above implementations may be combined at will to obtain multiple arrangement manners of evenly spaced distribution of the source leading-out contacts 12. For example, the source leading-out contacts 12 of the same row are distributed at equal intervals along the first direction (X), and meanwhile, the distances between two adjacent rows of the source leading-out contacts 12 are equal.

In implementations of the present disclosure, the source leading-out contacts 12 in the semiconductor device 100 are distributed on the surface of the source layer 1042 in an evenly spaced manner, while the source layer 1042 covers the channel structures 11, and the channel structures 11 are distributed relatively evenly around the respective source leading-out contacts 12, so that the distribution of voltage drops round all the source leading-out contacts 12 are the same approximately, which can reduce the voltage drops between the channel structures 11 and the source leading-out contacts 12, and improve the performance of the semiconductor device.

Figure 2:
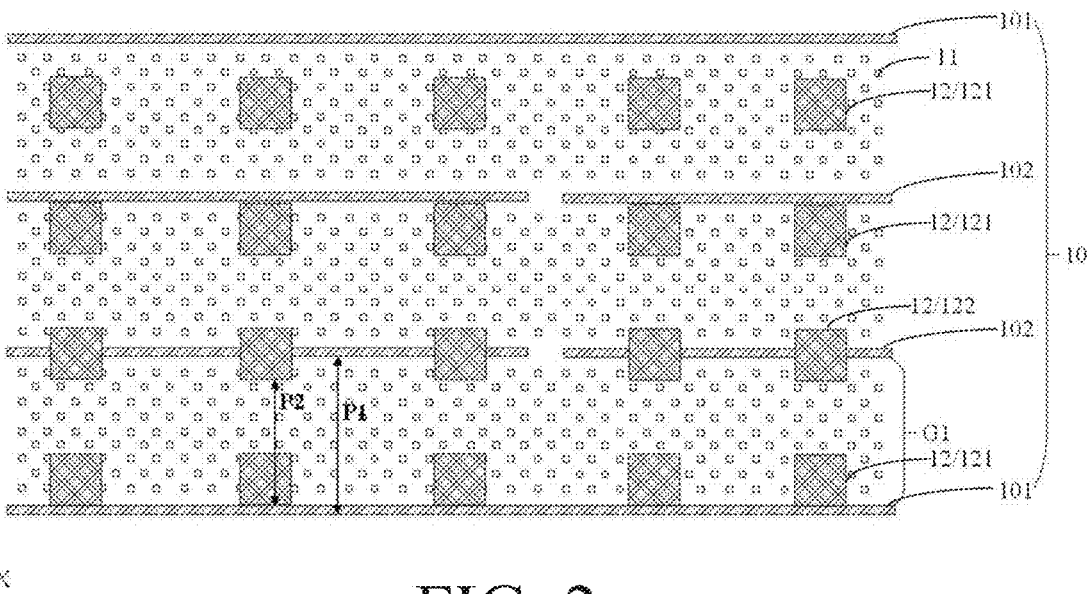
FIG. 2 is a top-down structural diagram II of a semiconductor device provided by a first implementation of the present disclosure.
Figure 3:
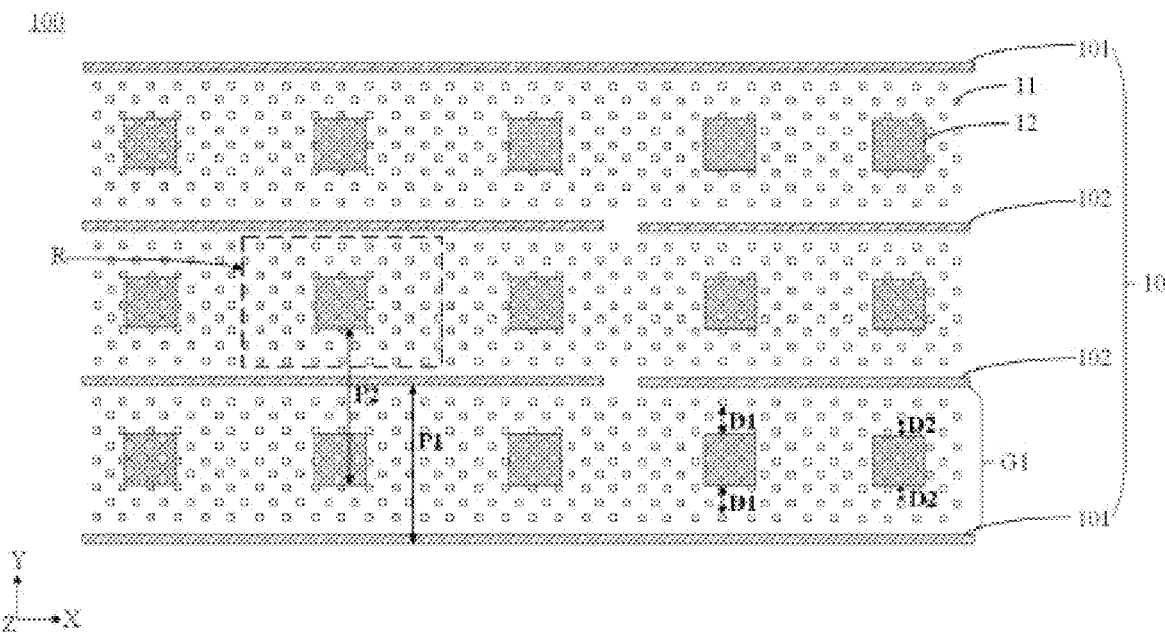
FIG. 3 is a top-down structural diagram III of a semiconductor device provided by a first implementation of the present disclosure.

Referring to FIGS. 1-3, FIGS. 1-3 may be considered as structural diagrams of a semiconductor device provided by a first implementation of the present disclosure, wherein FIG. 1 is a top-down structural diagram I of a semiconductor device provided by the first implementation of the present disclosure, FIG. 2 is a top-down structural diagram II of a semiconductor device provided by the first implementation of the present disclosure, and FIG. 3 is a top-down structural diagram III of a semiconductor device provided by the first implementation of the present disclosure.

In this implementation, two adjacent rows of source leading-out contacts 12 have a second pitch P2 in a second direction (Y) perpendicular to a first direction (X), and the second pitch P2 may refer to, in two adjacent rows of the source leading-out contacts 12 in FIGS. 1-3, a distance from the top of one row of the source leading-out contacts 12 to the top of one row of the source leading-out contacts 12 adjacent to that row of the source leading-out contacts 12, or a distance from the bottom of one row of the source leading-out contacts 12 to the bottom of one row of the source leading-out contacts 12 adjacent to that row of the source leading-out contacts 12.

As shown in FIG. 1, the first pitch P1 of the finger memory blocks G1 is smaller than the second pitch P2 between the source leading-out contacts 12. As shown in FIG. 2, the first pitch P1 of the finger memory blocks G1 is larger than the second pitch P2 between the source leading-out contacts 12. As shown in FIGS. 1 and 2, the source leading-out contacts 12 comprise first source leading-out contacts 121 and second source leading-out contacts 122. Projections of the first source leading-out contacts 121 on a plane (an XY plane) formed by the source layer 1042 are located between projections of two adjacent rows of the gate line slit structures 10 on the plane. Projections of the second source leading-out contacts 122 have overlapping portions with projections of the gate line slit structures 10 on the plane.

As shown in FIG. 3, the first pitch P1 of the finger memory blocks G1 is completely matched with the second pitch P2 of the source leading-out contacts 12, i.e., P1=P2, so that locations of all the source leading-out contacts 12 in one finger memory block G1 are the same, and then, voltage drop distributions around all the source leading-out contacts 12 are substantially the same.

Continuing referring to FIG. 3, if the source leading-out contacts 12 and the finger memory blocks G1 are projected onto one XY plane along the longitudinal direction (Z), each row of the source leading-out contacts 12 (arranged along the first direction (X)) may be located in the middles of the finger memory blocks G1, that is, the source leading-out contacts 12 are located in the middles of the finger memory blocks G1 in the second direction (Y); in the second direction (Y), the channel structures 11 on two sides of the source leading-out contacts 12 are all distributed symmetrically, and the voltage drop distributions on the two sides of the source leading-out contacts 12 are approximately the same. More particularly, in one finger memory block G1, distances D1 from the first row of channel structures 11 and from the ninth row of channel structures 11 to the source leading-out contacts 12 are the same (the same voltage drop), and distances D2 from the second row of channel structures 11 and from the eighth row of channel structures 11 to the source leading-out contacts 12 are the same (the same voltage drop), so that the voltage drop also changes uniformly in each finger memory block G1.

In the semiconductor device 100 provided by the first implementation of the present disclosure, the source leading-out contacts 12 are uniformly distributed on the source layer 1042, the distributions of the channel structures 11 around all the source leading-out contacts 12 are approximately the same, and voltage drop changes around all the source leading-out contacts 12 are the same approximately, which can make the voltage drops between the source leading-out contacts 12 and the channel structures 11 stable relatively, control the voltage drops in a smaller scope, and improve the device performance. In one implementation, the source leading-out contacts 12 in FIG. 3 are located in the middles of the finger memory blocks G1 to cause the channel structures 11 therearound to be distributed symmetrically with respect to the source leading-out contacts 12; for example, the channel structures 11 in a region R in FIG. 3 act as the channel structures 11 around the source leading-out contact 12 therein. Taking this region R as an example, the channel structures 11 above and below that source leading-out contact 12 in FIG. 3 are distributed symmetrically, and the channel structures 11 on the left and the right of that source leading-out contact 12 in FIG. 3 are distributed symmetrically.

Figure 5:
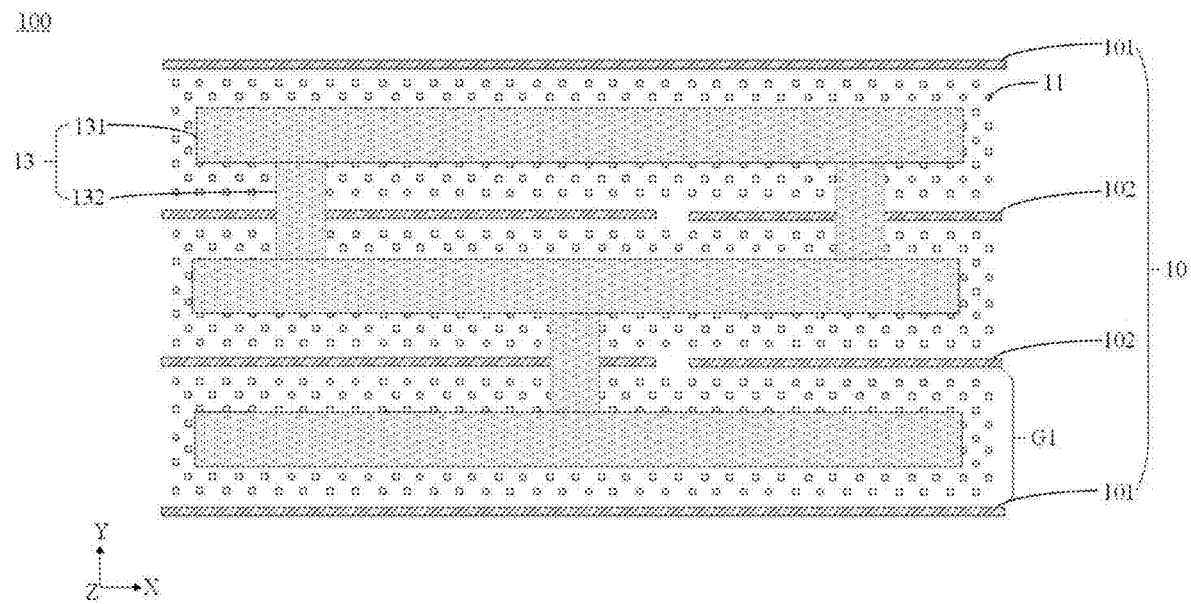
FIG. 5 is a top-down structural diagram of a semiconductor device with a metal interconnect layer provided by a first implementation of the present disclosure.

Continuing to refer to FIG. 5, FIG. 5 is a top-down structural diagram of a semiconductor device with a metal interconnect layer provided by a first implementation of the present disclosure. The semiconductor device 100 further comprises a metal interconnect layer 13 covering a plurality of source leading-out contacts 12. This implementation takes the semiconductor device 100 of FIG. 3 as an example to illustrate a pattern of the metal interconnect layer 13 of the semiconductor device 100. The metal interconnect layer 13 comprises a plurality of first routes 131 that extend continuously and are parallel, and a plurality of second routes 132 that connect two adjacent ones of the first routes 131 and intersect with (for example, are perpendicular to) the first routes 131. Therefore, all the metal routes are connected together, and in the event that one of the first routes 131 is broken somewhere, a signal may also be transmitted to the broken first route 131 through the other first routes 131 and the second routes 132, thereby improving the stability and reliability of signal transmission.

In this implementation, one first route 131 covers one row of source leading-out contacts 12, and the second routes 132 are located between two adjacent first routes 131 and disposed perpendicular to the first routes 131. Regions between two adjacent ones of the first routes 131 are second route regions, and the second routes 132 in two adjacent ones of the second route regions are in interleaved distribution.

It may be understood that for the structures of the metal interconnect layers of the semiconductor device 100 in FIGS. 1 and 2, referring to FIG. 5 the structures of the corresponding metal interconnect layers can be obtained by adjusting the distances between the first routes.

Figure 6:
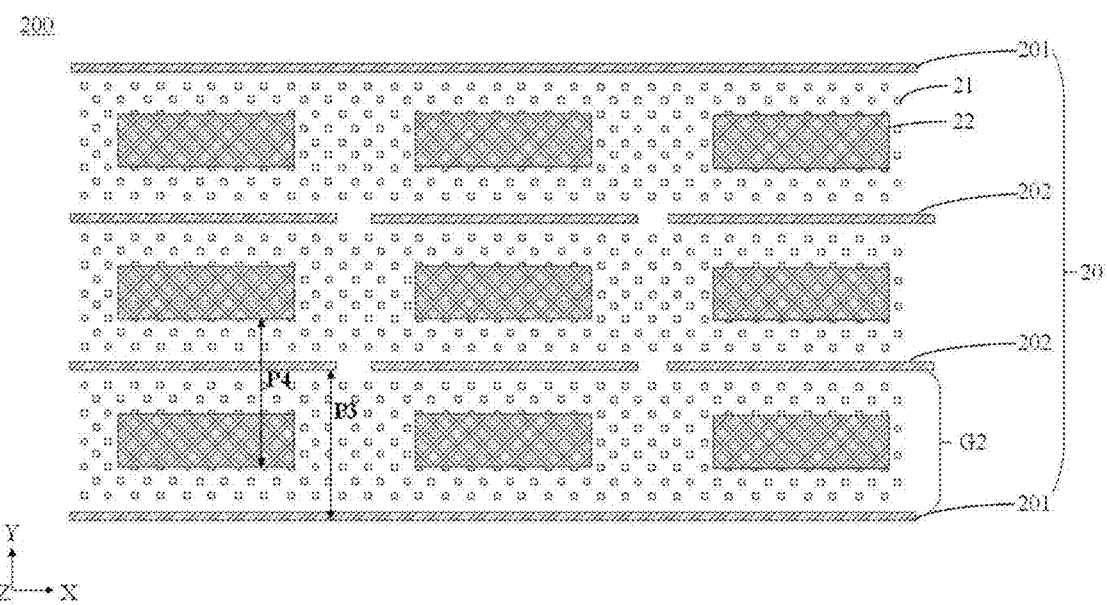
FIG. 6 is a top-down structural diagram I of a semiconductor device provided by a second implementation of the present disclosure.

Referring to FIG. 6, FIG. 6 is a top-down structural diagram I of a semiconductor device provided by a second implementation of the present disclosure. The semiconductor device 200 comprises a plurality of gate line slit structures 20 (comprising first gate line slit structures 201 and second gate line slit structures 202) extending in a first direction (X), channel structures 21 located between the plurality of gate line slit structures 20, a source layer electrically connected with the channel structures 21, a plurality of source leading-out contacts 22 on the source layer, and a metal interconnect layer covering the plurality of source leading-out contacts 22.

Top-down graphics of the source leading-out contacts 22 are strip-shaped, and orthographic projections of the source leading-out contacts 22 on the source layer are strip-shaped. The length direction of the source leading-out contacts 22 is consistent with the first direction (X), and the width direction thereof is consistent with a second direction (Y). The source leading-out contacts 22 of the same row are distributed at equal intervals along the first direction (X), and the source leading-out contacts 22 of different rows are aligned in the second direction (Y).

Any two adjacent rows of the gate line slit structures 20 have a first pitch P3 in the second direction (Y), any two adjacent rows of the source leading-out contacts 22 have a second pitch P4 in the second direction (Y), and the second pitch P4 is equal to the first pitch P3. It should be noted that the first pitch P3 refers to, in two adjacent rows of the gate line slit structures 20 in FIG. 6, a distance from the top of one row of the gate line slit structures 20 to the top of the other row of the gate line slit structures 20, or a distance from the bottom of one row of the gate line slit structures 20 to the bottom of the other row of the gate line slit structures 20. The second pitch P4 refers to, in two adjacent rows of the source leading-out contacts 22 in FIG. 6, a distance from the top of one row of the source leading-out contacts 22 to the top of the other row of the source leading-out contacts 22, or a distance from the bottom of one row of the source leading-out contacts 22 to the bottom of the other row of the source leading-out contacts 22.

In this implementation, the source leading-out contacts 22 are located between two rows of the gate line slit structures 20, and located in the middle of finger memory blocks G2 in the second direction (Y). That is, the distances from the source leading-out contacts 22 to the upper row of the gate line slit structures 20 and to the lower row of the gate line slit structures 20 are equal; accordingly, the channel structures 21 around each of source leading-out contacts 22 are distributed symmetrically; for example, in FIG. 6, the channel structures 21 above and below the source leading-out contacts 22 are distributed symmetrically, and the channel structures 21 on the left and the right of the source leading-out contacts 22 are distributed symmetrically.

Referring to the sectional view in FIG. 4, the source leading-out contacts 22 in the semiconductor device 200 in the second implementation increase contact area with the source layer in the first direction (X), and accordingly, a voltage drop as brought by resistance and capacitance can be decreased. Meanwhile, since the sizes of the source leading-out contacts 22 are increased in the first direction (X), the metal interconnect layer will be aligned more easily with the source leading-out contacts 22 during subsequent fabrication of the metal interconnect layer, and an effective process window of fabricating the source leading-out contacts 22 and the metal interconnect layer is also increased.

Figure 7:
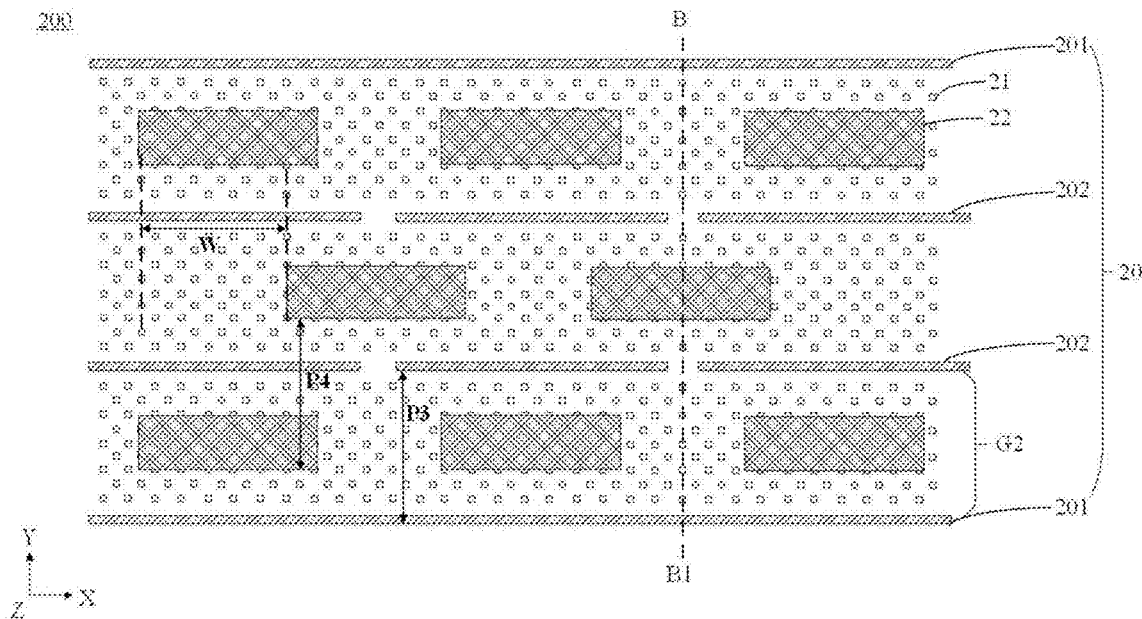
FIG. 7 is a top-down structural diagram II of a semiconductor device provided by a second implementation of the present disclosure.

Referring to FIG. 7, FIG. 7 is a top-down structural diagram II of a semiconductor device provided by a second implementation of the present disclosure. The semiconductor device 200 differs from the second implementation in that the source leading-out contacts 22 of different rows are not aligned one by one in the second direction (Y); particularly, the second row of the source leading-out contacts 22 are in misaligned distribution with respect to the first row of the source leading-out contacts 22 in the first direction (X). For example, a misaligned distance of the second row of the source leading-out contacts 22 is W as compared with the first row of the source leading-out contacts 22 in the first direction (X). One source leading-out contact 22 in the second row is just located in the middle of two adjacent source leading-out contacts 22 in the first row; in other words, if two adjacent source leading-out contacts 22 in one row have a symmetry axis B-B1, the left and the right of one source leading-out contact 22 in another row adjacent to that row of the source leading-out contacts 22 are symmetrical with respect to the symmetry axis B-B1. Therefore, the source leading-out contacts 22 arranged in a misaligned manner are also distributed uniformly in one memory block. In FIG. 7, the source leading-out contacts 22 may be located in the middle of finger memory blocks G2 to cause the voltage drop in each finger memory block G2 to change uniformly, which can improve the uniformity of the device performance.

Figure 8:
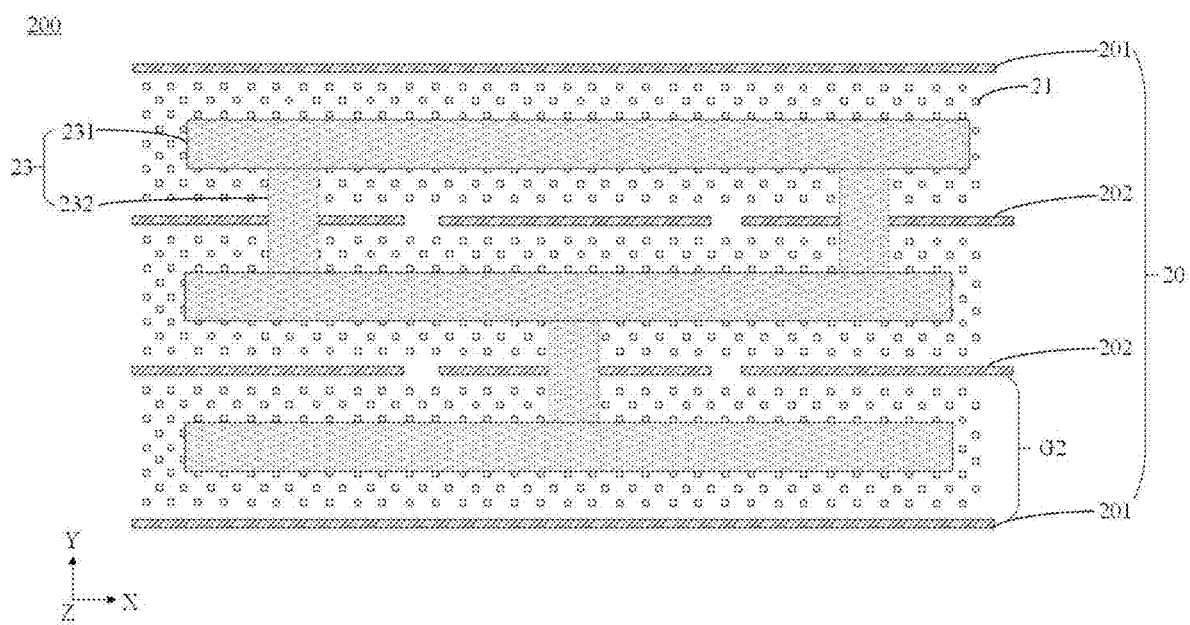
FIG. 8 is a top-down structural diagram of a semiconductor device with a metal interconnect layer provided by a second implementation of the present disclosure.

In conjunction with FIG. 8, FIG. 8 is a top-down structural diagram of a semiconductor device with a metal interconnect layer provided by a second implementation of the present disclosure. The semiconductor device 200 further comprises a metal interconnect layer 23 covering a plurality of source leading-out contacts 22, and the metal interconnect layer 23 comprises a plurality of first routes 231 that extend continuously and are parallel, and a plurality of second routes 232 that connect two adjacent ones of the first routes 231 and intersect with (e.g., are perpendicular to) the first routes 231. Therefore, all the metal routes are connected together, and in the event that one of the first routes 231 is broken somewhere, a signal may also be transmitted to the broken first route 231 through the other first routes 231 and the second routes 232.

In the second implementation, the plurality of first routes 231 cover the plurality of source leading-out contacts 22, and continuously extend along a length direction of the source leading-out contacts 22. Regions between two adjacent ones of the first routes 231 are second route regions, and the second routes 232 in two adjacent ones of the second route regions are in interleaved distribution. Particularly, an orthographic projection of one second route 232 in the second row on an XY plane is located in the middle of orthographic projections of two adjacent second routes 232 in the first row on the XY plane to cause the metal routes to be distributed in the memory blocks uniformly.

Figure 9:
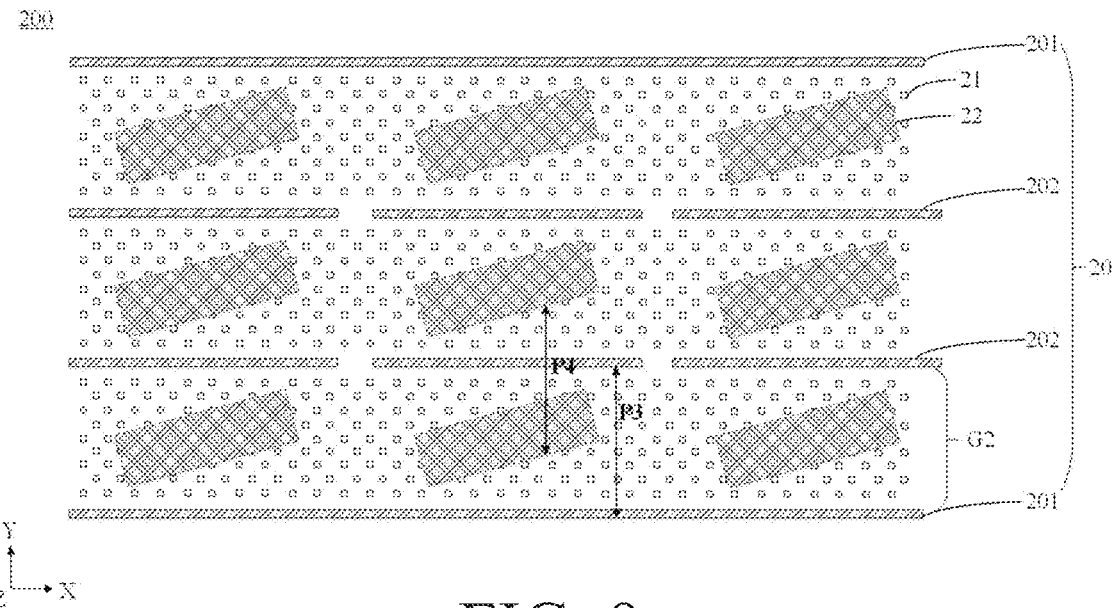
FIG. 9 is a top-down structural diagram III of a semiconductor device provided by a second implementation of the present disclosure.

Referring to FIG. 9, FIG. 9 is a top-down structural diagram III of a semiconductor device provided by a second implementation of the present disclosure. The semiconductor device 200 differs from FIG. 6 in that the length direction of the source leading-out contacts 22 has an included angle with a first direction (X). That is, the source leading-out contacts 22 are in skewed distribution in the finger memory blocks G2. In this implementation, the source leading-out contacts 22 are aligned in a second direction (Y). In some implementations, the source leading-out contacts 22 of different rows may be in interleaved distribution in the first direction (X), which may be referred to FIG. 7 for details.

Figure 10:
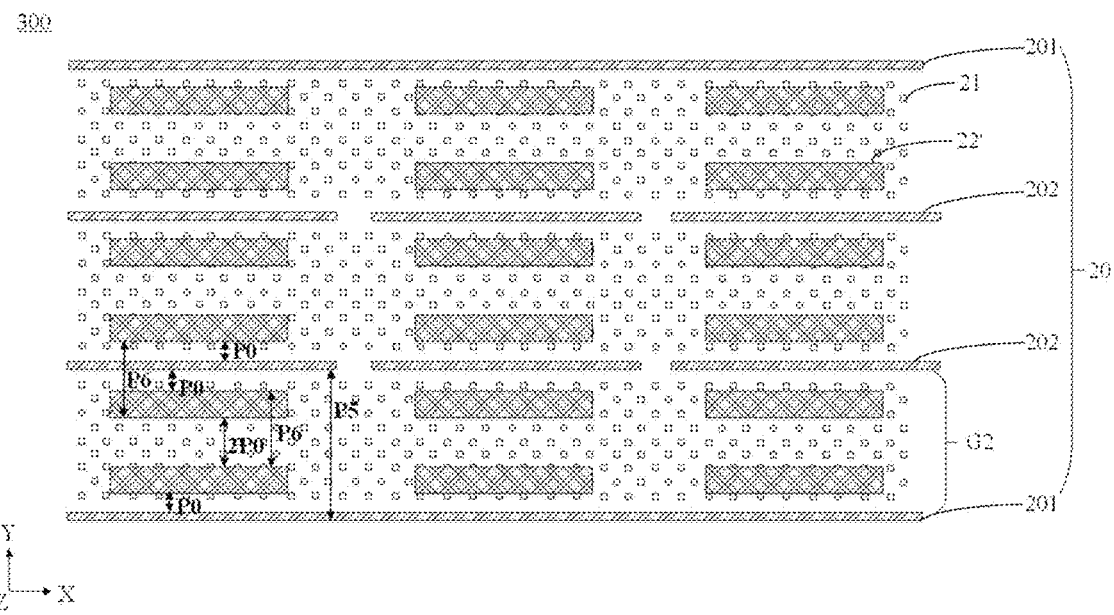
FIG. 10 is a top-down structural diagram of a semiconductor device provided by a third implementation of the present disclosure.

Referring to FIG. 10, FIG. 10 is a top-down structural diagram of a semiconductor device provided by a third implementation of the present disclosure. For ease of understanding, the semiconductor device 300 uses the same structure numbers as the semiconductor device 200 in the second implementation. The semiconductor device 300 differs from the semiconductor device 200 in that any adjacent gate line slit structures 20 have a first pitch P5 therebetween, any two adjacent rows of source leading-out contacts 22' have a second pitch P6 therebetween, and P5 is greater than P6. It should be noted that the first pitch P5 refers to, in two adjacent rows of the gate line slit structures 20 in FIG. 10, a distance from the top of one row of the gate line slit structures 20 to the top of the other row of the gate line slit structures 20, or a distance from the bottom of one row of the gate line slit structures 20 to the bottom of the other row of the gate line slit structures 20. The second pitch P6 refers to, in two adjacent rows of source leading-out contacts 22 in FIG. 10, a distance from the top of one row of the source leading-out contacts 22 to the top of the other row of the source leading-out contacts 22, or a distance from the bottom of one row of the source leading-out contacts 22 to the bottom of the other row of the source leading-out contacts 22.

Referring to FIG. 10, in some implementations, projections of two adjacent rows of the gate line slit structures 20 on the XY plane have therebetween projections of the plurality of rows of the source leading-out contacts 22' on the plane, that is, the projections of the adjacent gate line slit structures 20 have therebetween the projections of the plurality of rows of the source leading-out contacts 22'. In other words, one finger memory block G2 has a plurality of rows of source leading-out contacts 22' therein. In this implementation, one finger memory block G2 has two rows of source leading-out contacts 22' therein.

In some implementations, the distance between any source leading-out contact 22' and the adjacent gate line slit structure 20 is P0, and a distance between any two rows of the source leading-out contacts 22' is equal to 2P0. The difference between P6 and 2P0 is equal to the width of the source leading-out contact 22' in the second direction (Y).

In some implementations, P5=2P6, then the difference between P5 and 4P0 is equal to twice the width of the source leading-out contact 22'.

Figure 11:
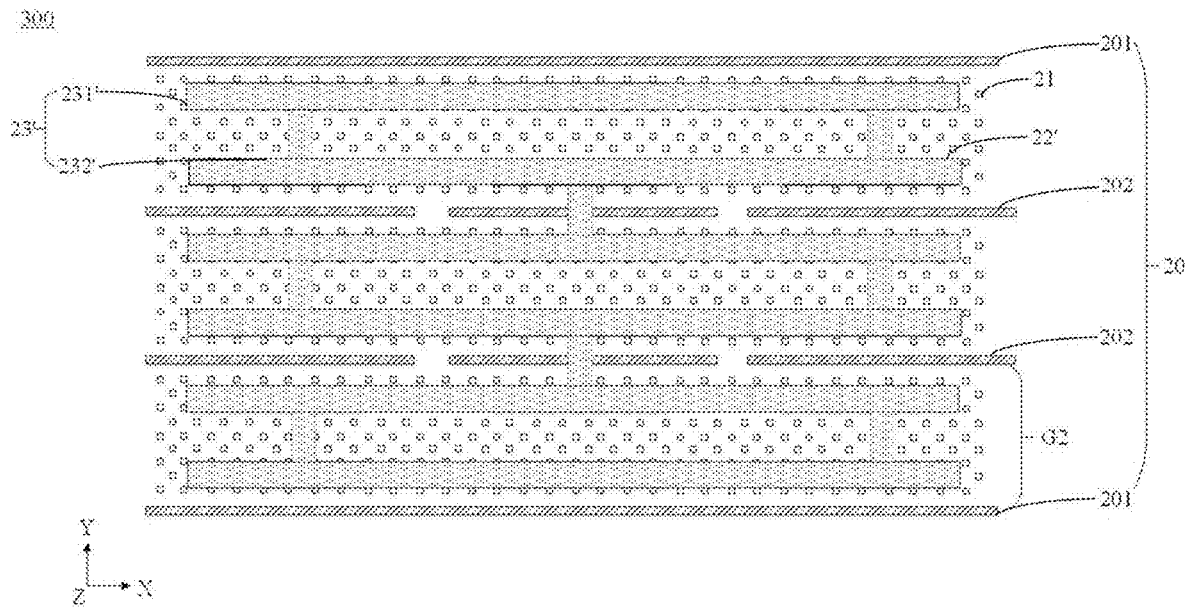
FIG. 11 is a top-down structural diagram of a semiconductor device with a metal interconnect layer provided by a third implementation of the present disclosure.

Referring to FIG. 11, FIG. 11 is a top-down structural diagram of a semiconductor device with a metal interconnect layer provided by a third implementation of the present disclosure. A route distribution condition of the metal interconnect layer 23' is similar to that in FIG. 8, with the exception that the number of first routes 231' is increased according to the number of rows of source leading-out contacts 22', so that the number of second routes 232' will be increased as well.

In some implementations, the width of the source leading-out contacts 22' in the second direction (Y) may be smaller than the width of the source leading-out contacts 22 in the second direction (Y) in the semiconductor device 200. The width of the source leading-out contacts 22' in the second direction (Y) may be smaller than the width of the source leading-out contacts 12 in the second direction (Y) in the semiconductor device 100, and the width of the source leading-out contacts 22' in the first direction (X) (which refers to a length of a strip-shaped source leading-out contact 22') may be smaller than the width of the source leading-out contacts 12 in the first direction (X) in the semiconductor device 100. In the event that the width of the source leading-out contacts 22' in the second direction (Y) is decreased, the width of the first routes 231' in the metal interconnect layer 23' in the second direction (Y) may also be decreased accordingly, thereby ensuring that pitches of the first routes 231' are not too small, and reducing electrical influence between the first routes 231'.

Figure 12:
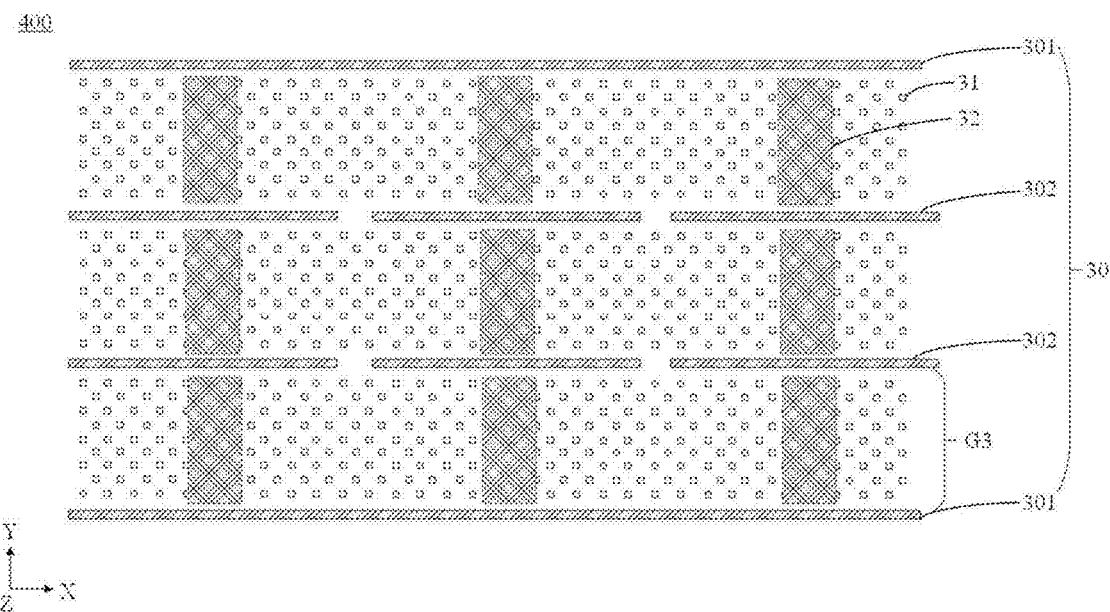
FIG. 12 is a top-down structural diagram I of a semiconductor device provided by a fourth implementation of the present disclosure.

Referring to FIG. 12, FIG. 12 is a top-down structural diagram I of a semiconductor device provided by a fourth implementation of the present disclosure. The semiconductor device 400 comprises gate line slit structures 30 (comprising first gate line slit structures 301 and second gate line slit structures 302), channel structures 31, a source layer, source leading-out contacts 32, and a metal interconnect layer. The semiconductor device 400 differs from the semiconductor device 200 in that azimuths of the source leading-out contacts 32 in finger memory blocks G3 are different, the length direction of the source leading-out contacts 32 is consistent with the second direction (Y), and the width direction thereof is consistent with the first direction (X). The source leading-out contacts 32 of different rows are aligned in the second direction (Y).

Figure 13:
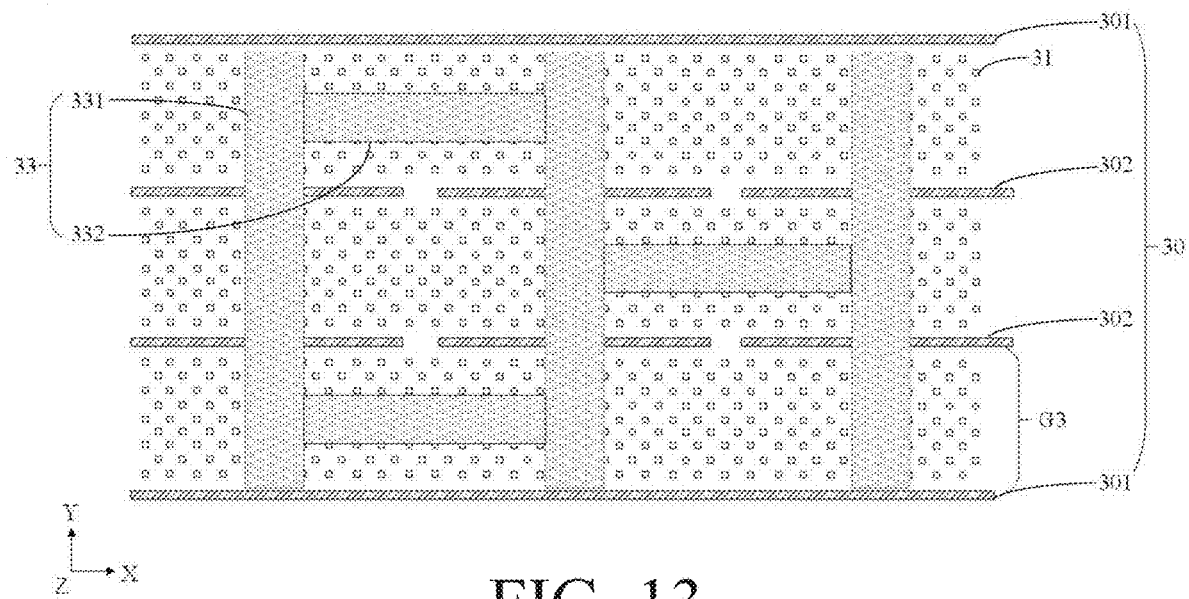
FIG. 13 is a top-down structural diagram I of a semiconductor device with a metal interconnect layer provided by a fourth implementation of the present disclosure.

Referring to FIG. 13, FIG. 13 is a top-down structural diagram I of a semiconductor device with a metal interconnect layer provided by a fourth implementation of the present disclosure. The semiconductor device 400 further comprises a metal interconnect layer 33 covering a plurality of source leading-out contacts 32. By taking the semiconductor device 400 in FIG. 12 as an example, the metal interconnect layer 33, which is similar to the metal interconnect layer 23 in FIG. 8 in pattern, comprises a plurality of first routes 331 that extend continuously and are parallel, and a plurality of second routes 332 that connect two adjacent ones of the first routes 331 and are perpendicular to the first routes 331. The plurality of first routes 331 cover the plurality of source leading-out contacts 32, and continuously extend along the length direction of the source leading-out contacts 32, and the second routes 332 in adjacent second route regions are in interleaved distribution in the second direction (Y).

Figure 14:
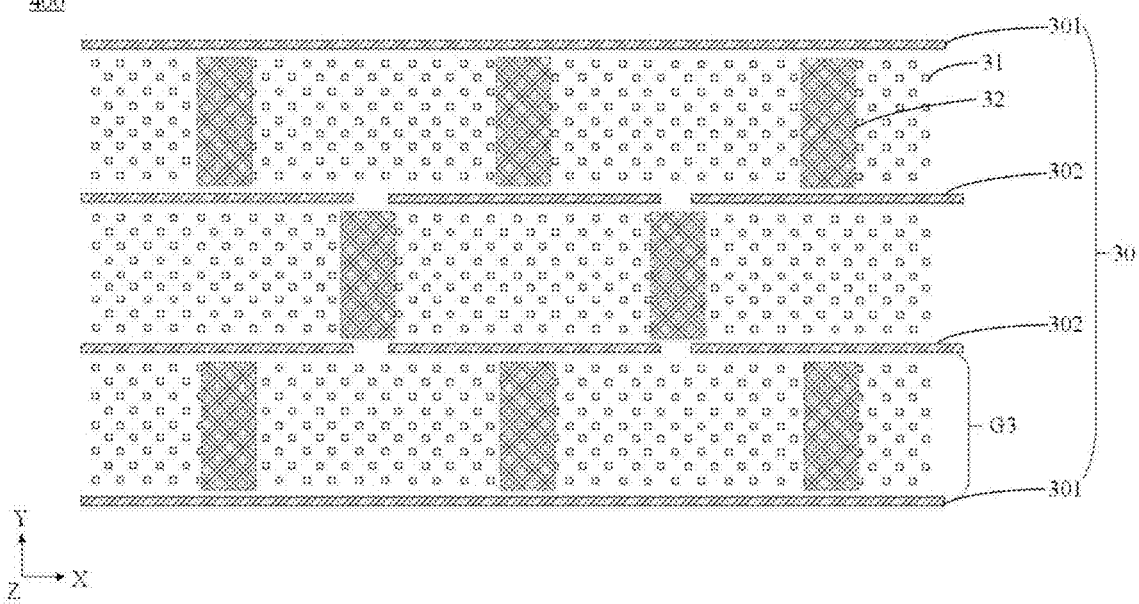
FIG. 14 is a top-down structural diagram II of a semiconductor device provided by a fourth implementation of the present disclosure.

Referring to FIG. 14, FIG. 14 is a top-down structural diagram II of a semiconductor device provided by a fourth implementation of the present disclosure. The semiconductor device 400 differs from the semiconductor device 300 in the fourth implementation in that the source leading-out contacts 32 of different rows are in misaligned distribution in the first direction (X). In some implementations, one row of the source leading-out contacts 32 is just located in the middle of an adjacent row of the source leading-out contacts 32, and the source leading-out contacts 32 of two rows with one row apart are aligned in the second direction (Y), so that the source leading-out contacts 32 are distributed uniformly in memory blocks, thereby controlling a voltage drop within a smaller scope.

Figure 15:
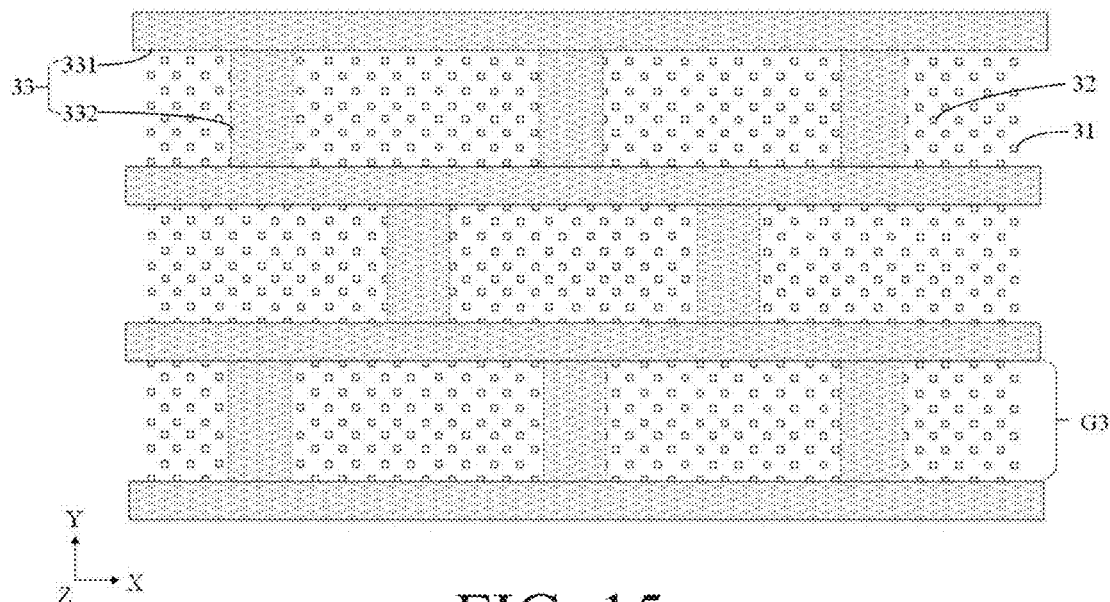
FIG. 15 is a top-down structural diagram II of a semiconductor device with a metal interconnect layer provided by a fourth implementation of the present disclosure.

Referring to FIG. 15, FIG. 15 is a top-down structural diagram II of a semiconductor device with a metal interconnect layer provided by a fourth implementation of the present disclosure. In this implementation, by taking the semiconductor device 400 in FIG. 14 as an example, the metal interconnect layer 33 comprises a plurality of first routes 331 that extend continuously and are parallel, and a plurality of second routes 332 that connect two adjacent ones of the first routes 331 and are perpendicular to the first routes 331. As can be seen from the second implementation of FIG. 8, the third implementation of FIG. 11 and the fourth implementation of FIG. 13, the first routes 331 extending continuously are all along the length direction of source leading-out contacts 32. However, in the implementation of FIG. 15, the continuous first routes 331 extend along gate line slit structures 30, and each first route 331 covers one row of the gate line slit structures 30, and two adjacent rows of the first routes 331 are connected with two ends of the source leading-out contacts 32. The second routes 332 just cover the source leading-out contacts 32, and the second routes 332 are the same as the source leading-out contacts 32 in number and location, with the exception that the second routes 332 are longer and wider than the source leading-out contacts 32.

Figure 16:
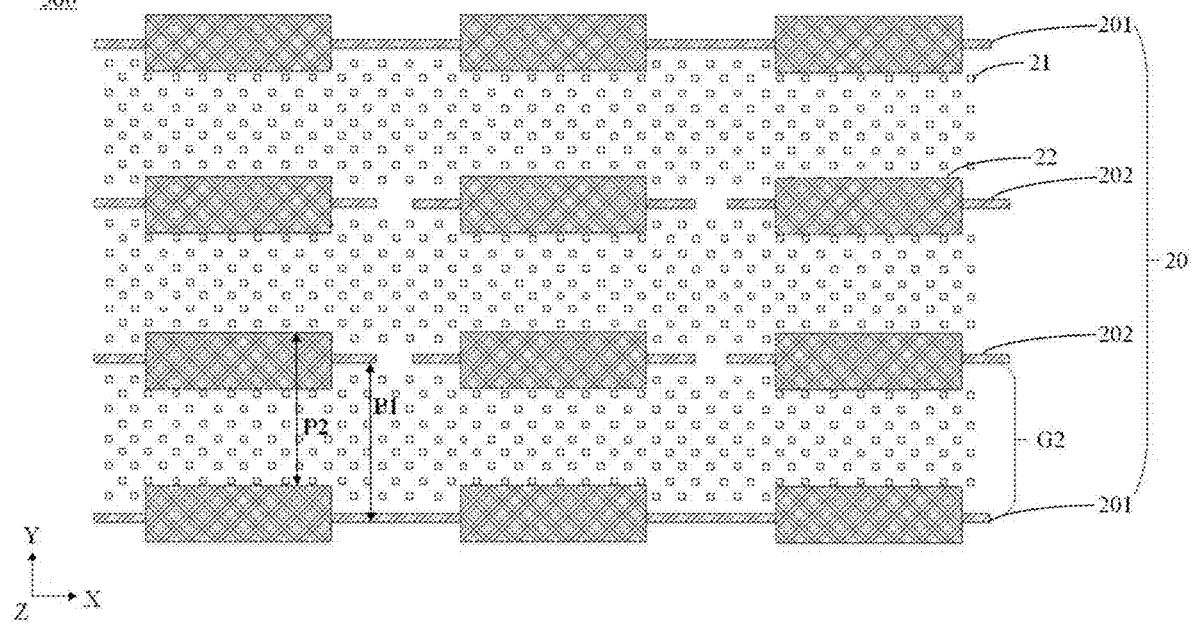
FIG. 16 is a top-down structural diagram of a semiconductor device provided by a fifth implementation of the present disclosure.

Referring to FIG. 16, FIG. 16 is a top-down structural diagram of a semiconductor device provided by a fifth implementation of the present disclosure. For ease of understanding, the semiconductor device 500 continues to use structure numbers in the semiconductor device 200. The semiconductor device 500 differs from the semiconductor device 200 in that source leading-out contacts 22 have overlapping portions with gate line slit structures 20 when the source leading-out contacts 22 and the gate line slit structures 20 are projected onto one XY plane along the longitudinal direction (Z). For example, projections of the source leading-out contacts 22 on the XY plane along the longitudinal direction (Z) are symmetrical with respect to projections of the gate line slit structures 20 on the XY plane along the longitudinal direction (Z).

In the fifth implementation, the metal interconnect layer is the same as the metal interact layer 23 in the second implementation in pattern, and the metal interconnect layer of the semiconductor device 500 in the fifth implementation may be obtained by moving the entire pattern of the metal interconnect layer 23 in FIG. 8 for some distance in the second direction (Y) to move the metal interconnect layer 23 to a location coinciding with the gate line slit structures 20.

Figure 17:
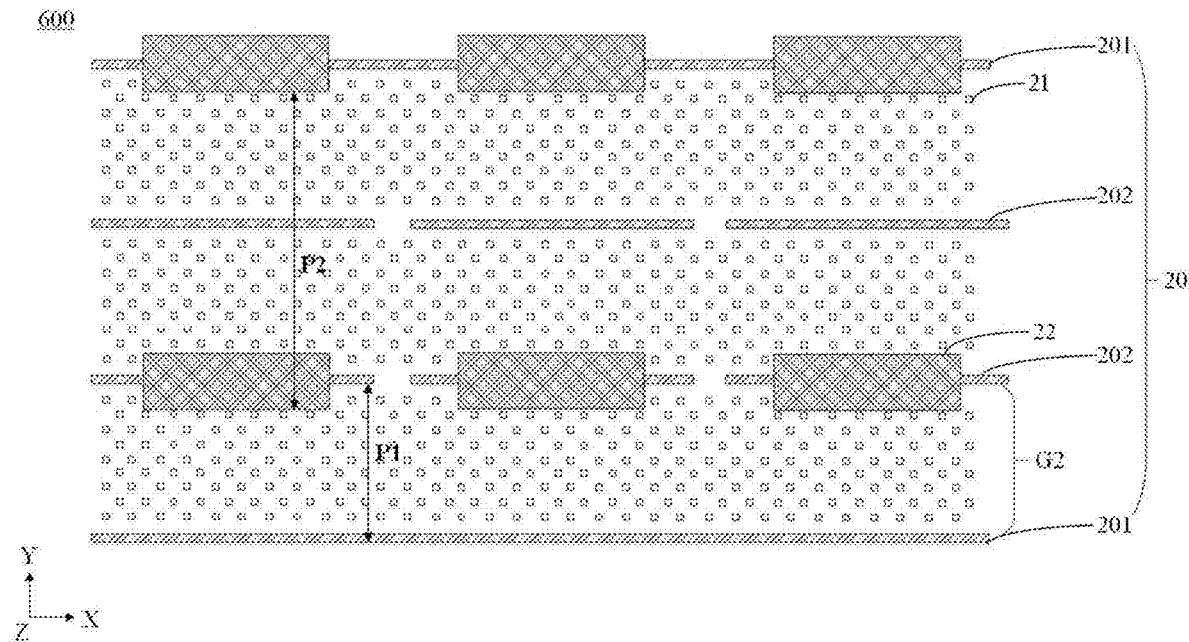
FIG. 17 is a top-down structural diagram of a semiconductor device provided by a sixth implementation of the present disclosure.

Referring to FIG. 17, FIG. 17 is a top-down structural diagram of a semiconductor device provided by a sixth implementation of the present disclosure. For ease of understanding, the semiconductor device 600 continues to use structure numbers in the semiconductor device 200. Source leading-out contacts 22 have overlapping portions with gate line slit structures 20 when the source leading-out contacts 22 and the gate line slit structures 20 are projected onto one XY plane along the longitudinal direction (Z).

The semiconductor device 600 differs from the semiconductor device 500 in the fifth implementation in that, a first pitch P1 between two rows of the gate line slit structures 20 is smaller than a second pitch P2 between two rows of the source leading-out contacts 22, for example, P2=2P1. Such distribution of the source leading-out contacts 22 may also cause distribution conditions of channel structures around each of the source leading-out contacts 22 to be the same, that is, the channel structures 21 around the source leading-out contacts 22 are distributed symmetrically, with uniform changes in distance, so that voltage drops from the channel structures 21 to the source leading-out contacts 22 change uniformly, which can improve the uniformity of the device performance.

In some implementations, to decrease the scope of the voltage drops, the sizes of the source leading-out contacts 22 may be increased, which is equivalent to an increase in the contact area between the source leading-out contacts 22 and the source layer. For example, the source leading-out contacts 22 in the semiconductor device 600 may be larger than the source leading-out contacts 22 in the semiconductor device 500 in size.

Figure 18:
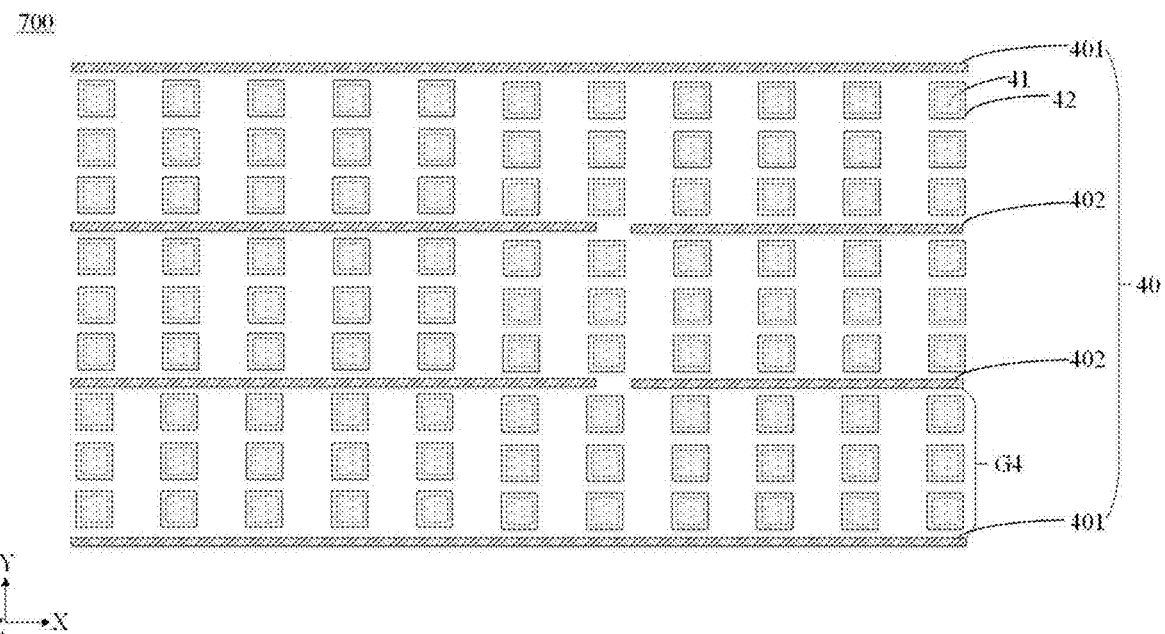
FIG. 18 is a top-down structural diagram of a semiconductor device provided by a seventh implementation of the present disclosure.

Referring to FIG. 18, FIG. 18 is a top-down structural diagram of a semiconductor device provided by a seventh implementation of the present disclosure. The semiconductor device 700 comprises a plurality of rows of gate line slit structures 40, and channel structures 41 between two adjacent rows of the gate line slit structures 40. The gate line slit structures 40 comprise at least two rows of first gate line slit structures 401, and at least one row of second gate line slit structures 402 between two adjacent rows of the first gate line slit structures 401. One finger memory block G4 may be between two adjacent rows of the gate line slit structures 40. It should be noted that the channel structures 41 cannot be seen in the top-down view actually, and structures of the channel structures 41 are shown in FIG. 18 only in order to show a location relationship between source leading-out contacts 42 and the channel structures 41.

In some implementations, the plurality of source leading-out contacts 42 are disposed in one-to-one correspondence with the plurality of channel structures 41. In some implementations, the plurality of channel structures 41 are in an evenly spaced distribution, and the plurality of source leading-out contacts 42 are also in an evenly spaced distribution. The orthographic projection of each source leading-out contact 42 on an XY plane has an overlapping portion with the orthographic projection of one channel structure 41 on the XY plane. In one implementation, the orthographic projections of the channel structures 41 are located in the middle of the orthographic projections of the source leading-out contacts 42.

Figure 19:
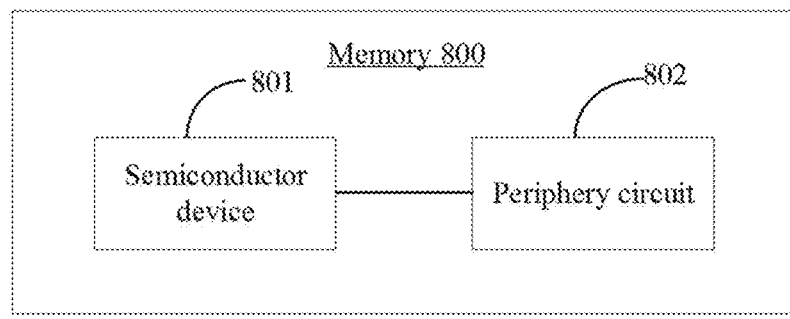
FIG. 19 is a structural diagram of a memory device provided by implementations of the present disclosure.

Referring to FIG. 19, FIG. 19 is a structural diagram of a memory device provided by implementations of the present disclosure. The memory device 800 may be a three-dimensional memory device, for example, a 3D NAND memory device and a 3D NOR memory device.

The memory device 800 comprises a semiconductor device 801 and a periphery circuit 802. The semiconductor device 801 may be any semiconductor device in the above implementations, and the periphery circuit 802 may be a COMS (complementary metal oxide semiconductor). The periphery circuit 802 is electrically connected with the semiconductor device 801 to communicate a signal with the semiconductor device 801. The periphery circuit 802 may be used for logical operation and to control and detect switching states of various memory cells in the above semiconductor device 801 through metal lines to implement storage and reading of data.

The semiconductor device 801 comprises: an array device comprising a plurality of channel structures, and a source layer connected with the plurality of channel structures; and a plurality of source leading-out contacts connected with the source layer. The plurality of source leading-out contacts and the plurality of channel structures are located on two sides of the source layer respectively, and orthographic projections of the plurality of source leading-out contacts on the source layer are in evenly spaced distribution.

Figure 20:
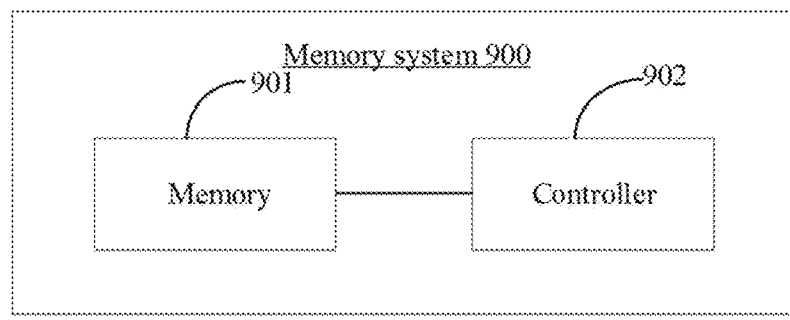
FIG. 20 is a structural diagram of a memory system provided by implementations of the present disclosure.

Referring to FIG. 20, FIG. 20 is a structural diagram of a memory system provided by implementations of the present disclosure. The memory system 900 comprises a memory device 901 and a controller 902. The memory device 901 may be the memory device in any of the above implementations, and may comprise any semiconductor device in the above implementations. The controller 902 is electrically connected with the memory device 901 and used to control the memory device 901 to store data, and the memory device 901 may perform an operation of storing the data based on the control of the controller 902.

In some implementations, the memory system may be implemented as, for example, a universal flash storage (UFS) apparatus, a solid state disk (SSD), a multimedia card in MMC, eMMC, RS-MMC and micro-MMC forms, a secure digital card in SD, mini-SD and micro-SD forms, a memory apparatus of a Personal Computer Memory Card International Association (PCMCIA) card type, a memory apparatus of a Peripheral Component Interconnect (PCI) type, a memory apparatus of a PCI Express (PCI-E) type, a compact flash (CF) card, a smart media card, or a memory stick, or the like.

The semiconductor device in the memory device 901 comprises an array device comprising a plurality of channel structures, and a source layer connected with the plurality of channel structures; and a plurality of source leading-out contacts connected with the source layer. The plurality of source leading-out contacts and the plurality of channel structures are located on two sides of the source layer, respectively, and orthographic projections of the plurality of source leading-out contacts on the source layer are in evenly spaced distribution.

The above explanations of the implementations are merely used to assist in understanding the technical solutions of the present disclosure and their core thoughts. Those of ordinary skill in the art should understand that they may modify the technical solutions as set forth in the foregoing implementations, or make equivalent replacements for part of the technical features, but these modifications or replacements do not cause the essence of the respective technical solutions to depart from the scope of the technical solutions of the various implementations of the present disclosure.

What is claimed is:

1. A semiconductor device, comprising:
    an array device comprising channel structures, and a source layer connected with the channel structures; and
    source leading-out contacts connected with the source layer;
    wherein
    the source leading-out contacts and the channel structures are located on two sides of the source layer;
    two adjacent rows of gate line slit structures have a first pitch between the two adjacent rows of the gate line slit structures, and two adjacent rows of the source leading-out contacts have a second pitch between the two adjacent rows of the source leading-out contacts, the first pitch being less than the second pitch; and
    orthographic projections of the source leading-out contacts on the source layer are in evenly spaced distribution.

2. The semiconductor device of claim 1, wherein
    the semiconductor device further comprises rows of the gate line slit structures extending along a first direction parallel to the source layer.

3. The semiconductor device of claim 2, wherein
    the source leading-out contacts are arranged into multiple rows along the first direction; and
    the source leading-out contacts of a same row are distributed at equal intervals along the first direction.

4. The semiconductor device of claim 3, wherein an orthographic projection of a row of the source leading-out contacts on the source layer is located between orthographic projections of two adjacent rows of the gate line slit structures on the source layer.

5. The semiconductor device of claim 4, wherein the orthographic projection of the row of the source leading-out contacts on the source layer is located in a center between the orthographic projections of the two adjacent rows of the gate line slit structures on the source layer.

6. The semiconductor device of claim 2, wherein
    the source leading-out contacts are arranged into multiple rows along the first direction;
    and
    the second pitches between any two adjacent rows of the source leading-out contacts are the same.

7. The semiconductor device of claim 2, wherein an orthographic projection of a row of the gate line slit structures on the source layer is located between orthographic projections of two adjacent rows of the source leading-out contacts on the source layer.

8. The semiconductor device of claim 2, wherein an orthographic projection of a row of the source leading-out contacts on the source layer has an overlapping portion with an orthographic projection of one of the gate line slit structures on the source layer.

9. The semiconductor device of claim 2, wherein
    the source leading-out contacts comprise first source leading-out contacts and second source leading-out contacts;
    orthographic projections of the first source leading-out contacts on the source layer are located between orthographic projections of two adjacent rows of the gate line slit structures on the source layer; and
    orthographic projections of the second source leading-out contacts on the source layer have overlapping portions with orthographic projections of the gate line slit structures on the source layer.

10. The semiconductor device of claim 1, wherein
    orthographic projections of the source leading-out contacts on the source layer are strip-shaped; and
    a length direction thereof is disposed along a first direction parallel to the source layer.

11. The semiconductor device of claim 1, wherein
    the source leading-out contacts are arranged into multiple rows along a first direction parallel to the source layer; and the multiple rows of the source leading-out contacts are aligned in a second direction that is perpendicular to the first direction and parallel to the source layer.

12. The semiconductor device of claim 1, wherein the source leading-out contacts are arranged into multiple rows along a first direction parallel to the source layer; and two adjacent rows of the source leading-out contacts are in misaligned distribution in the first direction.

13. The semiconductor device of claim 1, wherein the semiconductor device further comprises a metal interconnect layer covering the source leading-out contacts.

14. The semiconductor device of claim 1, wherein orthographic projections of the source leading-out contacts on the source layer are round or square.

15. The semiconductor device of claim 1, wherein the source layer is configured to continuously cover each of the channel structures between the two adjacent rows of the gate line slit structures.

16. The semiconductor device of claim 1, wherein in a plane view, one of the source leading-out contacts corresponds to and covers a plurality of channel structures.

17. The semiconductor device of claim 1, wherein an orthographic projection of one source leading-out contact of the source leading-out contacts overlaps with orthographic projections of a group of channel structures of the channel structures on the source layer.

18. The semiconductor device of claim 17, wherein the group of channel structures is arranged into m adjacent rows and n adjacent columns, each of m and n being greater than 1.

19. A memory device, comprising:
a semiconductor device, comprising:
an array device comprising channel structures, and a source layer connected with the channel structures; and
source leading-out contacts connected with the source layer,
wherein
the source leading-out contacts and the channel structures are located on two sides of the source layer;
two adjacent rows of gate line slit structures have a first pitch between the two adjacent rows of the gate line slit structures, and two adjacent rows of the source leading-out contacts have a second pitch between the two adjacent rows of the source leading-out contacts, the first pitch being less than the second pitch; and
orthographic projections of the source leading-out contacts on the source layer are in evenly spaced distribution; and
a periphery circuit electrically connected with the semiconductor device.

20. A memory system, comprising:
a memory device, comprising:
a semiconductor device, comprising:
an array device comprising channel structures, and a source layer connected with the channel structures; and
source leading-out contacts connected with the source layer,
wherein
the source leading-out contacts and the channel structures are located on two sides of the source layer;
two adjacent rows of gate line slit structures have a first pitch between the two adjacent rows of the gate line slit structures, and two adjacent rows of the source leading-out contacts have a second pitch between the two adjacent rows of the source leading-out contacts, the first pitch being less than the second pitch; and
orthographic projections of the source leading-out contacts on the source layer are in evenly spaced distribution; and
a periphery circuit electrically connected with the semiconductor device; and
a controller electrically connected with the memory device and used for controlling the memory device to store data.

* * * * *